United States Patent
Soika et al.

(10) Patent No.: US 8,238,992 B2
(45) Date of Patent: Aug. 7, 2012

(54) ARRANGEMENT FOR CURRENT LIMITING

(75) Inventors: Rainer Soika, Hannover (DE); Mark Stemmle, Hannover (DE)

(73) Assignee: Nexans, Paris (FR)

( * ) Notice: Subject to any disclaimer, the term of this patent is extended or adjusted under 35 U.S.C. 154(b) by 338 days.

(21) Appl. No.: 12/639,495

(22) Filed: Dec. 16, 2009

(65) Prior Publication Data
US 2010/0179062 A1 Jul. 15, 2010

(30) Foreign Application Priority Data
Jan. 15, 2009 (EP) ..................................... 09290031

(51) Int. Cl.
*H01L 39/24* (2006.01)
(52) U.S. Cl. .......................... 505/232; 505/163; 505/230
(58) Field of Classification Search .................. 505/163, 505/232, 230
See application file for complete search history.

(56) References Cited

U.S. PATENT DOCUMENTS

| | | | | |
|---|---|---|---|---|
| 5,546,261 A * | 8/1996 | Yoshida et al. | | 361/19 |
| 6,448,501 B1 * | 9/2002 | McIntyre et al. | | 174/125.1 |
| 7,151,225 B2 * | 12/2006 | Fujikami | | 174/125.1 |
| 2006/0217269 A1 | 9/2006 | Bock et al. | | |
| 2008/0083546 A1 * | 4/2008 | Allais et al. | | 174/15.5 |

FOREIGN PATENT DOCUMENTS

EP 2209129 * 7/2010

* cited by examiner

*Primary Examiner* — Paul Wartalowicz
(74) *Attorney, Agent, or Firm* — Sofer & Haroun, LLP

(57) ABSTRACT

An arrangement is specified for current limiting having a superconducting cable (SK) which is arranged in a cryostat (KR) which has an outer wall which comprises two metallic tubes (1, 2) which are arranged concentrically with respect to one another and between which vacuum insulation (3) is incorporated. The cryostat (KR) surrounds a free space (FR) for a coolant to pass through, in which free space (FR) the superconducting cable (SK) is arranged. It also has an inner wall (IW) which surrounds a cylindrical cavity (HR) and likewise comprises two metallic tubes (4, 5) which are arranged concentrically with respect to one another, between which vacuum insulation (6) is incorporated, and which is located within the outer wall (AW) and is separated therefrom by the free space (FR). The superconducting cable (SK) which has a superconducting conductor, a dielectric surrounding the same and a superconducting screen which is arranged above the same, is wound in a helical shape around the inner wall (IW). An iron core (7) is arranged in the cylindrical cavity (HR).

2 Claims, 1 Drawing Sheet

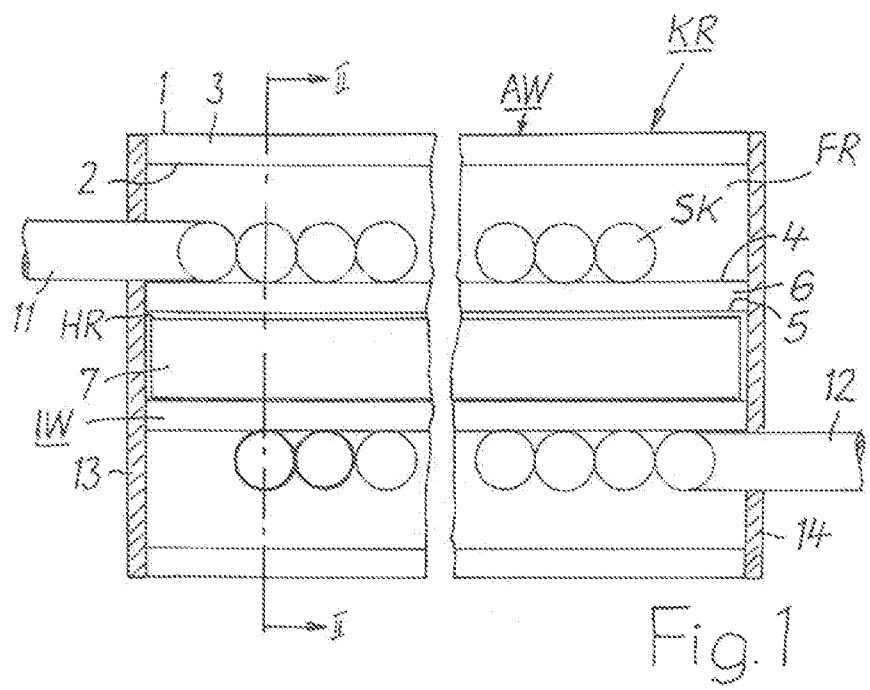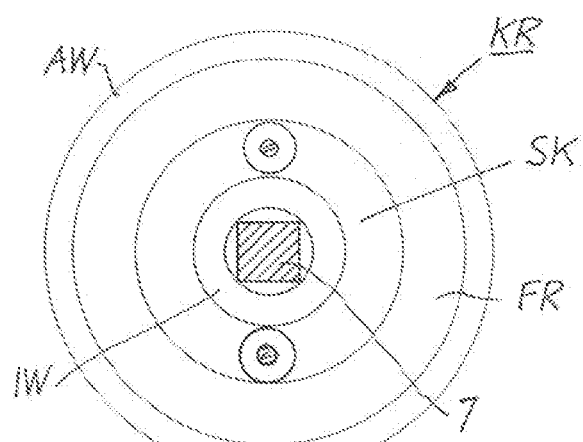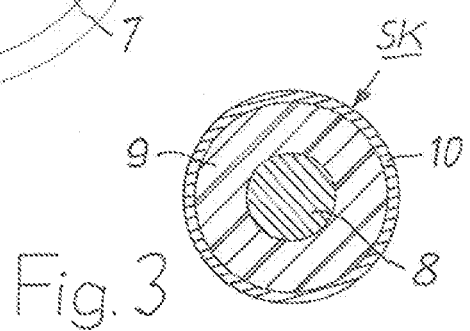

ARRANGEMENT FOR CURRENT LIMITING

RELATED APPLICATION

This application claims the benefit of priority from European Patent Application No. 09 290 031.5, filed on Jan. 15, 2009, the entirety of which is incorporated by reference

BACKGROUND

1. Field of the Invention

The invention relates to an arrangement for current limiting having a superconducting cable which is arranged in a cryostat which has an outer wall which comprises two metallic tubes which are arranged concentrically with respect to one another and between which vacuum insulation is incorporated, and which surrounds a free space for a coolant to pass through, in which free space the superconducting cable is arranged (EP 1 681 731 A1).

2. Description of Related Art

In modern technology, a superconducting cable has electrical conductors composed of a composite material which contains ceramic material which changes to the superconducting state at sufficiently low temperatures. The electrical direct-current resistance of a correspondingly designed conductor is zero when the cooling is adequate, provided that a specific current level, the critical current level, is not exceeded. Suitable ceramic materials, are, for example, YBCO (yttrium barium copper oxide) or BSCCO (bismuth strontium calcium copper oxide). Sufficiently low temperatures to change a material such as this to the superconducting state are, for example, between 67 K and 110 K. Suitable coolants are, for example, nitrogen, helium, neon and hydrogen or mixtures of these substances.

An arrangement for current limiting as described initially can be incorporated as a type of fuse into any desired cable run or else a switchgear assembly as a transmission path, via which or in which currents of greater or lesser magnitude can be transmitted. The aim is to prevent considerable damage from occurring thereto in the event of a short on the transmission path. A considerable increase in the electrical impedance of the arrangement which occurs in the event of a short triggers a mechanism by means of which the transmission path is disconnected from the supply current source. Once the reason for the short has been rectified, the transmission path can be switched on again without having to change the current-limiting arrangement at all.

EP 1 681 731 A1 as mentioned initially, describes a superconducting component for current limiting. This comprises a cylindrical support composed of superconducting material, around which a superconducting conductor is wound. A normal conductor is connected in parallel with this. A plurality of such components are connected electrically in series in order to produce a current limiter.

OBJECTS AND SUMMARY

The invention is based on the object of making the arrangement as described initially simpler.

This object is achieved according to the invention:
  in that the cryostat has an inner wall which surrounds a cylindrical cavity and likewise comprises two metallic tubes which are arranged concentrically with respect to one another, between which vacuum insulation is incorporated, and which is located within the outer wall and is separated therefrom by the free space,
  in that the superconducting cable which has a superconducting conductor, a dielectric surrounding the same and a superconducting screen which is arranged above the same, is wound in a helical shape around the inner wall, and
  in that an iron core is arranged in the cylindrical cavity.

This arrangement, which represents a superconducting current limiter, is produced, for example, by winding a superconducting cable with a cold dielectric around the inner wall of the cryostat, with this inner wall surrounding an iron core which is located in the cylindrical cavity. The iron core is located in the cavity outside the cable cryostat. It is therefore not influenced by the coolant located in the free space, but remains at room temperature even during operation of the arrangement. The short-circuit power which is created as a consequence of a short on the transmission path in which the arrangement is installed is absorbed very largely in the iron core, which must be appropriately designed. The superconducting cable in the arrangement is designed such that the critical current level in its screen is lower than the critical current level in the conductor. The screen is expediently specified such that its critical current level corresponds to the current level above which short-circuit current limiting is intended to take place. The cable conductor is advantageously designed such that both a temperature increase in the event of a short and alternating-current losses during continuous operation are sufficiently low to ensure low-loss continuous operation and short cooling-down times.

In the case of a superconducting cable with a cold dielectric, as is used in the arrangement, the current flowing in the screen is induced from the conductor. It generally has the same amplitude as the current in the conductor that is phase-shifted through 180° with respect to that current. In this case, provided that the superconducting screen is operated well below its critical current level, no resistive voltage drop can be detected on the screen. In the case of the present arrangement, current limiting now takes place in that scarcely any further increase in the current level in the screen takes place once the critical current level has been reached in the screen. The magnetic field produced by the conductor is then no longer screened. It therefore also propagates outside the screen, and in particular in the iron core, around which the superconducting cable is arranged, with the interposition of the inner wall of the cryostat. This directly results in a considerable increase in the inductance of the conductor, that is to say in an increase in its electrical impedance. The short-circuit current flowing via the conductor is therefore noticeably and quickly limited. The heating which occurs in known superconducting cables as a result of a high short-circuit current is accordingly considerably reduced. This ensures that the arrangement is not damaged by a short-circuit current. After the cause of the short on the transmission path has been rectified, it is ready to operate again without any further measures.

BRIEF DESCRIPTION OF THE DRAWINGS

One exemplary embodiment of the subject matter according to the invention is illustrated in the drawings, in which:
  FIG. 1 shows a longitudinal section through an arrangement according to the invention.
  FIG. 2 shows a section through FIG. 1, along the line II-II.
  FIG. 3 shows a section through a superconducting cable which can be used in the arrangement.

DETAILED DESCRIPTION

FIG. 1 shows a section through a cryostat KR which has an outer wall AW and an inner wall IW. The outer wall AW comprises two metallic tubes 1 and 2 which are arranged concentrically with respect to one another and between which vacuum insulation 3 is incorporated. The inner wall IW, which is arranged at a distance from the outer wall AW, likewise comprises two metallic tubes 4 and 5, which are arranged concentrically with respect to one another and between which vacuum insulation 6 is incorporated. The tubes 1 and 2 as well as 4 and 5 are advantageously composed of stainless steel and have the advantage of having relatively thick walls, which are adequate for robustness of the arrangement, and may be corrugated transversely with respect to their longitudinal direction. For the sake of simplicity, the tubes 1 and 2 as well as 4 and 5 are illustrated only by single lines in FIGS. 1 and 2.

A free space FR for a coolant to be passed through is located between the outer wall AW and the inner wall IW, which preferably runs co-axially with respect thereto, of the cryostat. A superconducting cable SK is arranged in the free space FR and is wound around the inner wall IW. FIG. 3 shows the layout of the cable SK. The inner wall IW surrounds a cylindrical cavity HR in which an iron core 7 is arranged, which extends over the entire length of the arrangement and, as illustrated in the drawing in FIG. 2, has a square cross section. However, the iron core 7 may also have a different cross-sectional shape, for example a circular shape. It advantageously has a relative permeability $\mu_r$ of more than 10.

The arrangement according to the invention is introduced into a transmission path for electric current, for its operation. For this purpose, corresponding cables or contacts of the transmission path are connected to the ends 11 and 12 of the cable SK, which are passed out of the cryostat KR in a pressure-tight manner. The overall dimensions of the arrangement are dependent on the voltage level at which the transmission path is operated, and they may correspond to those of commercially available transformers.

The superconducting cable SK is a cable with a cold dielectric. It comprises a superconducting conductor 8, a dielectric 9 which surrounds the same and a superconducting screen 10 which rests thereon. BSCCO is advantageously used as the superconducting material for the conductor 8. It would, however, also be possible to use YBCO if the conductor 8 were to be made robust by means of normally conductive material. The conductor 8 is designed such that its critical current level is higher than the critical current level in the screen 10. The screen 10 is advantageously composed of YBCO, and preferably has no normal conductor for robustness. The level of the respective critical current levels depends on the voltage level at which the transmission path equipped with the arrangement is operated.

The superconducting cable SK is wound around the inner wall IW of the cryostat KR in order to produce the arrangement as shown in FIG. 1. Its two ends 11 and 12 are advantageously bent in a straight line for contact-making purposes, such that they project out of the cryostat KR in the finished arrangement. The iron core 7 is inserted into the cylindrical cavity HR after this, or else before it. The inner wall IW fitted in this way is then introduced into the outer wall AW, and is fixed therein in as coaxial a form as possible. By way of example, end plates 13 and 14 may be used for this purpose, by means of which the cryostat KR and its free space FR are hermetically sealed. The ends 11 and 12 of the cable SK are passed through the end plates 13 and 14 in a pressure-tight manner. The end plates 13 and 14 are also equipped with connecting elements for a coolant to be passed into and out of.

For use, the arrangement that has been finished in this way is connected in a transmission path for electric current. The superconducting cable SK is then part of this transmission path. A short occurring thereon results in a current at an increased current level. If this is higher than the critical current level of the screen 10 of the cable SK, its electrical resistance suddenly increases considerably, resulting in a sudden increase in the electrical impedance of the arrangement: This is registered in a corresponding monitoring circuit and leads to immediate disconnection of the transmission path. The cause of the short can then be rectified.

Because of the increased current level, which is higher than the critical current level of the screen 10, the screen 10 loses its screening function, as a result of which the magnetic field from the conductor 8 enters the iron core 7. The electrical resistance of the conductor 8 and therefore of the cable SK is in consequence suddenly considerably increased—as already mentioned—resulting in the transmission path being disconnected. The cable SK and therefore the entire arrangement are not damaged in this case. The briefly occurring heating of the coolant is minor. This is quickly cancelled again, as a result of which the arrangement is once again fully operable once the transmission path has been repaired and reconnected.

The invention claimed is:

1. Arrangement for current limiting for a superconducting cable comprising:
   a superconducting cable;
   a cryostat, wherein said superconducting cable is arranged in said cryostat; and
   an iron core extending along said cryostat,
   wherein said cryostat has an outer wall made from two metallic tubes arranged concentrically with respect to one another with vacuum insulation in between, said outer wall of said cryostat surrounding a free space for a coolant to pass through, and in which free space the superconducting cable is arranged,
   wherein, the cryostat further having an inner wall within said outer wall, separated by said free space, and made from two metallic tubes arranged concentrically with respect to one another with vacuum insulation in between, said inner wail surrounding cylindrical cavity,
   wherein the superconducting cable is constructed with a superconducting conductor, a dielectric surrounding said conductor, and a superconducting screen which surrounds said dielectric, and wherein said superconducting cable, in said free space between said outer wall and said inner wall, is wound in a helical shape around an outer surface of said inner wall,
   wherein said iron core is arranged in the cylindrical cavity.

2. Arrangement according to claim 1, wherein the critical current level in the conductor of the superconducting cable is higher than the critical current level in the screen thereof.

* * * * *